United States Patent [19]

Inazaki et al.

[11] 3,946,371

[45] Mar. 23, 1976

[54] DRIVE SYSTEM FOR MEMORY MATRIX PANEL

[75] Inventors: Kenzoo Inazaki, Takarazuka; Yoshiharu Kanatani, Tenri; Masahiro Ise, Tenri; Etsuo Mizukami, Tenri; Chuji Suzuki, Nara, all of Japan

[73] Assignee: Sharp Kabushiki Kaisha, Osaka, Japan

[22] Filed: Jan. 27, 1975

[21] Appl. No.: 544,337

[30] Foreign Application Priority Data

| | | |
|---|---|---|
| Jan. 25, 1974 | Japan | 49-11274 |
| May 13, 1974 | Japan | 49-53636 |
| Aug. 9, 1974 | Japan | 49-91812 |

[52] U.S. Cl. .................. 340/173 PL; 340/324 M

[51] Int. Cl.[2] .................. G11C 11/28

[58] Field of Search .................. 340/173 PL, 324 M

[56] References Cited

UNITED STATES PATENTS 3,877,006 4/1975 Reboul .................. 340/173 PL

*Primary Examiner*—Terrell W. Fears

*Attorney, Agent, or Firm*—Stewart and Kolasch, Ltd.

[57] ABSTRACT

The present disclosure is directed toward a drive method and circuit for a memory matrix panel which comprises a light-emitting body having hysteresis behavior responsive to application of a desired AC voltage, a plurality of horizontal electrodes disposed on a first major surface of the light-emitting body and a plurality of vertical electrodes disposed on a second major surface of the light-emitting body, each cross point of the both electrodes providing a light-emitting unit point in a matrix array. A period of the applied AC voltage includes at least three sections wherein, prior to the writing, erasing or reading of information, a horizontal maintenance pulse having an amplitude necessary to maintain light emittance is applied to the plurality of horizontal electrodes during the first section thereof and a vertical maintenance pulse having an amplitude necessary to maintain light emittance is applied to the vertical electrodes during the second section thereof. In order to perform the writing, erasing or reading of information on a selected cross point, the vertical (or horizontal) electrode associated with such point receives an enable pulse having the shape identical with that of the horizontal maintenance pulse but the phase shifted into the third section, whereas the associated horizontal (or vertical) electrode receives write, erase or read out each having a predetermined amplitude necessary to perform the write, erase or read operation, the respective amplitude being superimposed on the enable pulse.

1 Claim, 17 Drawing Figures

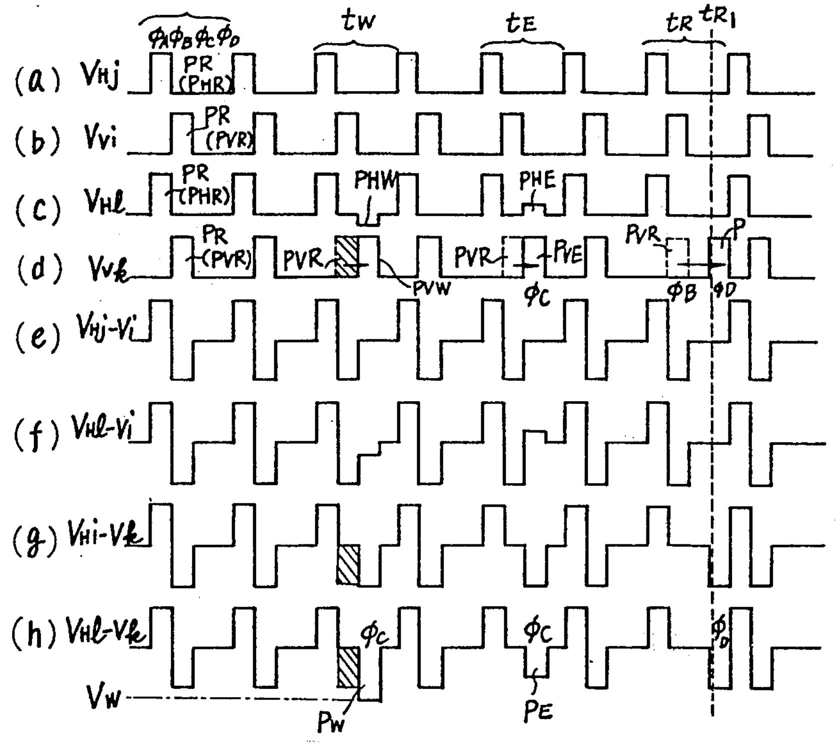
FIG. 7
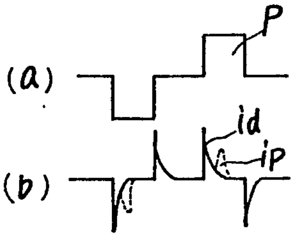
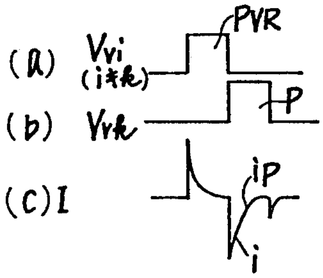
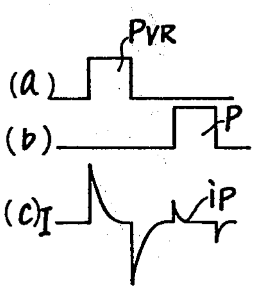
FIG. 8 FIG. 9 FIG. 10

(VERTICAL GATE)

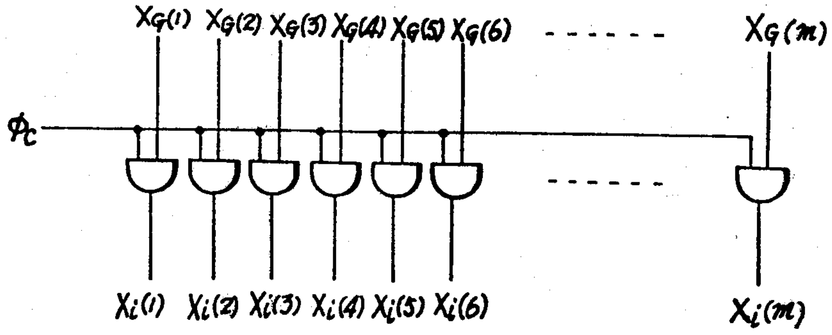
FIG. 13
(HORIZONTAL GATE)
FIG. 14 (VERTICAL DRIVER)
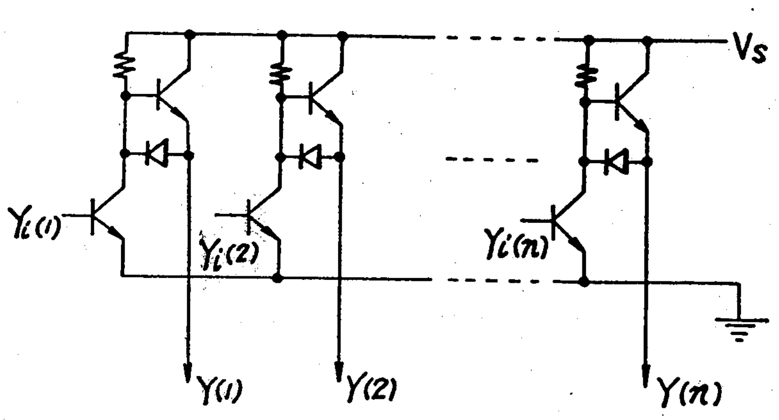

FIG. 15 (HORIZONTAL DRIVER)
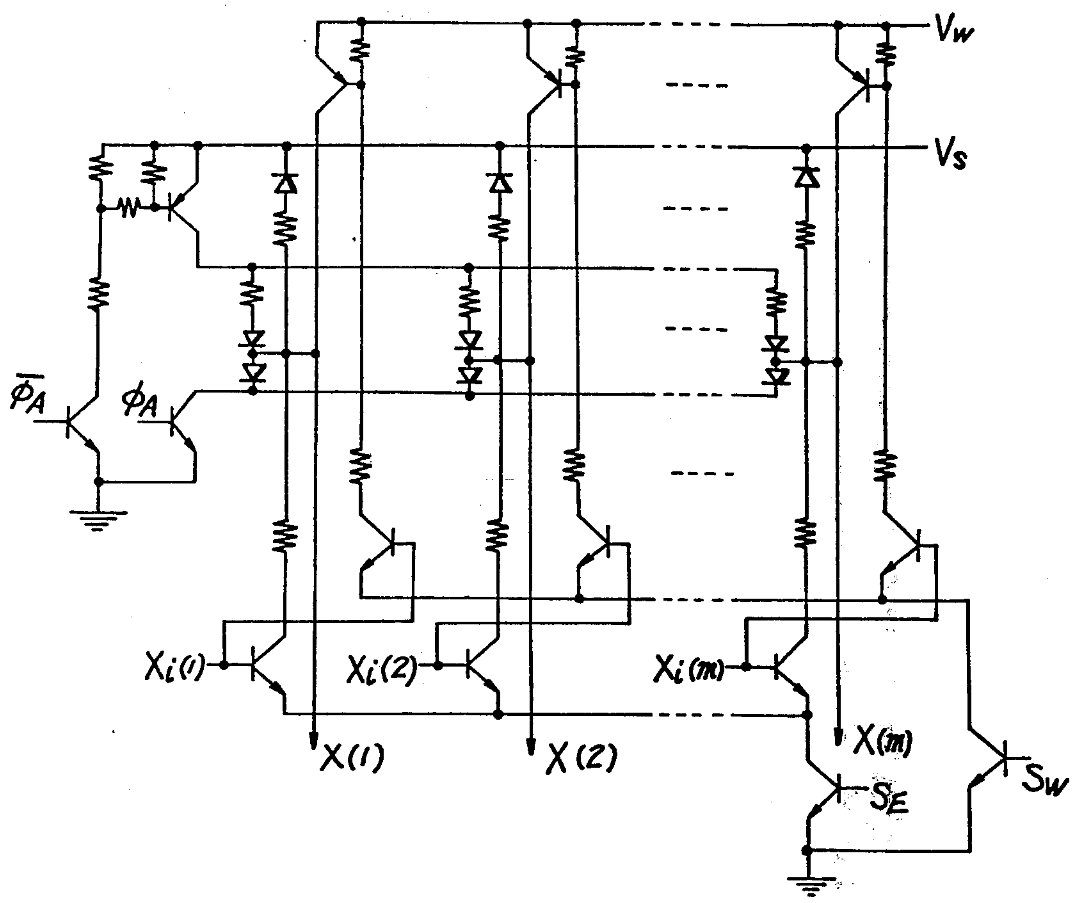

DRIVE SYSTEM FOR MEMORY MATRIX PANEL

The present invention relates to a drive system or circuit for a memory matrix panel made of material having a light emitting property with hysteresis behavior, for example, such as a ZnS thin-film light-emitting element.

Recently, a new fact has been discovered that a certain type of the light-emitting elements such as ZnS thin-film light-emitting elements exhibits hysteresis behavior in its light emitting mechanism. Thus, utilization of such hysteresis behavior makes it possible to provide the light-emitting elements with memory capability so that a matrix of such light-emitting body may provide character display functions in a two-dimensional manner.

Accordingly, it is an object of the present invention to provide a drive system or method suited for such a memory matrix having light-emitting characteristics and hysteresis behavior exhibited therein.

The above-mentioned and other object and features of the present invention and the manner of attaining them will become more apparent and the invention itself will be best understood by reference to the following description of an embodiment of the invention taken in conjunction with the accompanying drawings, wherein.

Figure 6A:
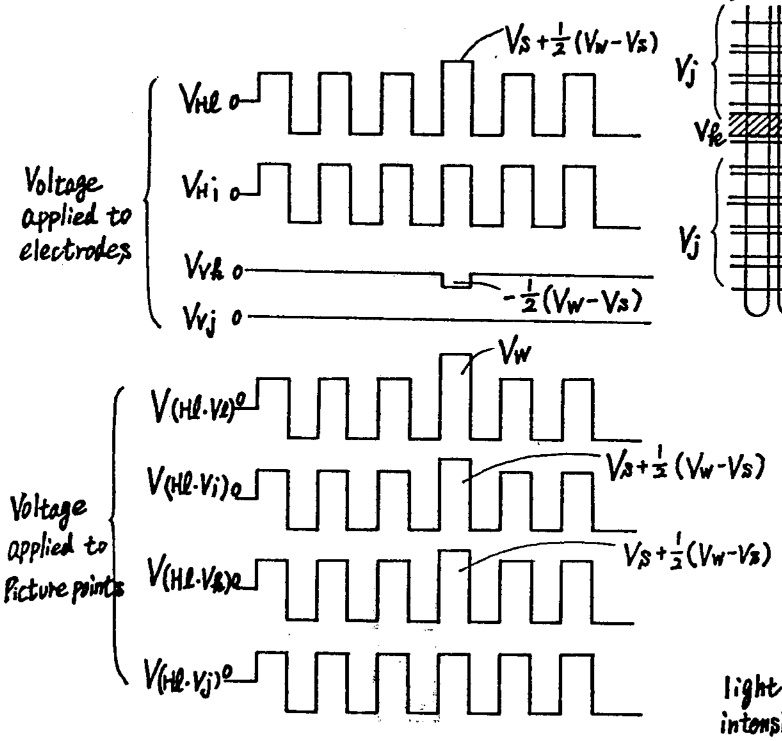
Figure 6B:
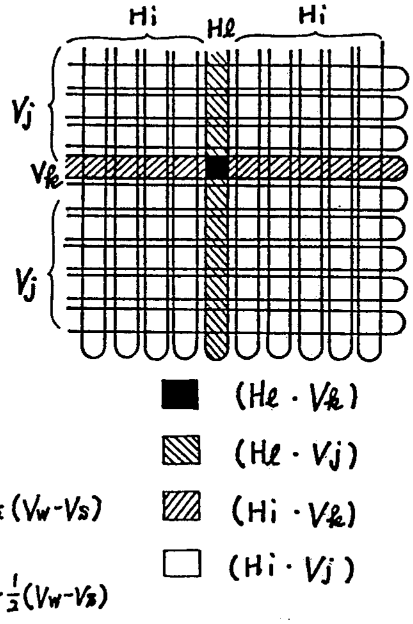
Figure 6C:
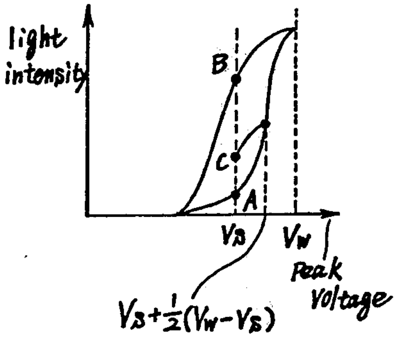
Figure 11:
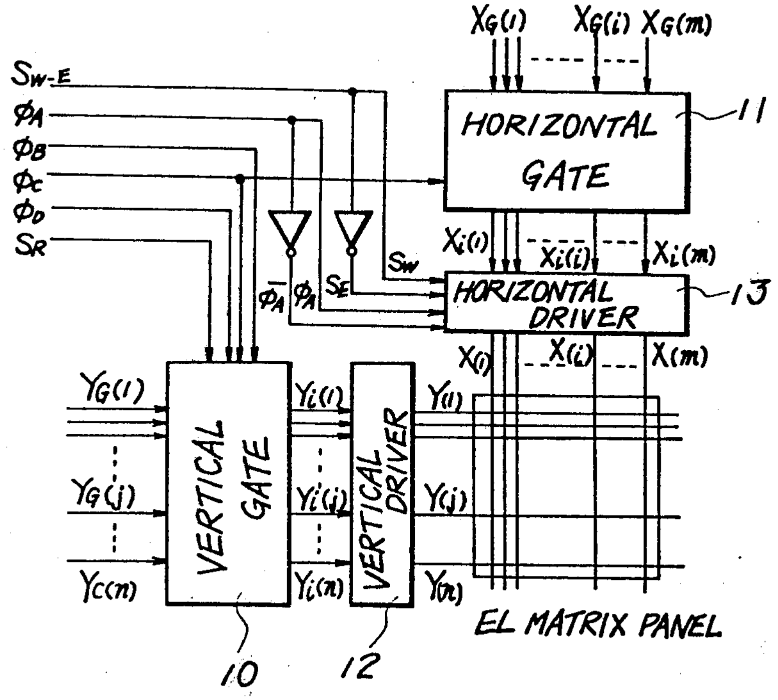
Figure 12:
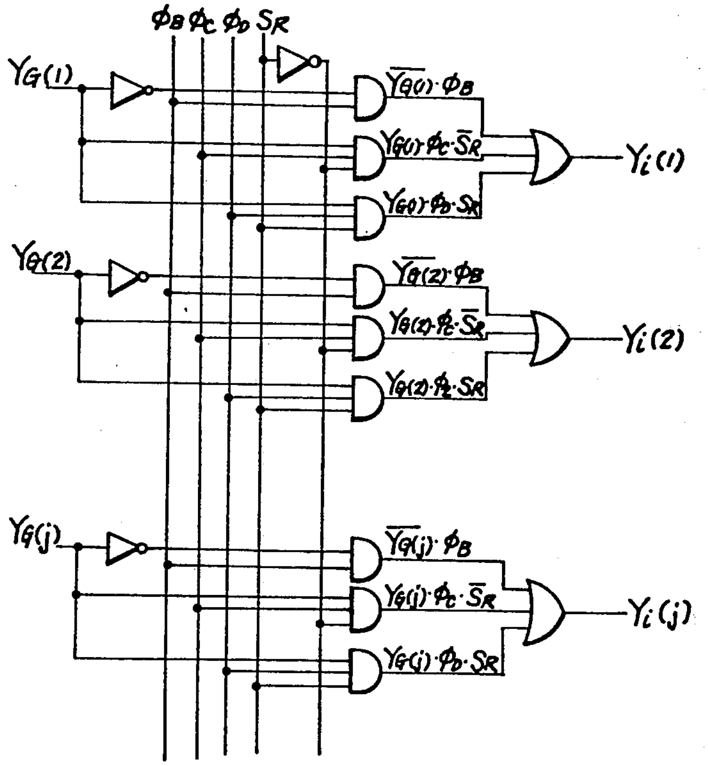

FIGS. 6 (including FIGS. 6A–6C) through 10 are time charts used for explanation of a drive system and method according to the present invention;

FIG. 11 is a block diagram showing one embodiment of the drive system of the present invention;

FIG. 12 is a circuit diagram showing a vertical gate used in the system of FIG. 11;

FIG. 13 is a circuit diagram showing a horizontal gate used in the system of FIG. 11;

FIG. 14 is a circuit diagram showing a vertical driver used in the system of FIG. 11, and FIG. 15 is a circuit diagram showing a horizontal driver used in the system of FIG. 11.

Before discussing a drive system and method in greater detail, it may be of advantage to illustrate a light emitting element with reference to FIGS. 1 through 4.

Figure 1:
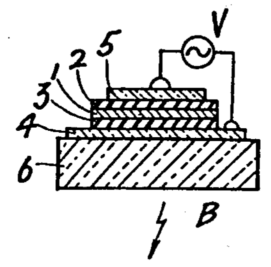
FIG. 1 is a cross-sectional view of a ZnS thin-film light-emitting element.
Figure 2:
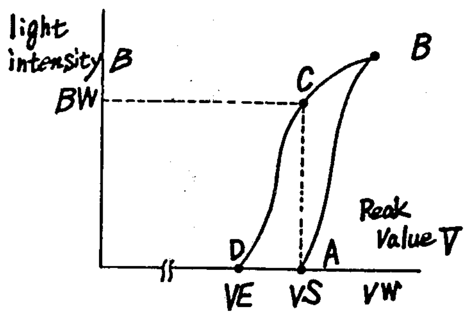
FIG. 2 is a Graph showing a hysteresis curve in the element shown in FIG. 1.

FIG. 1 shows a basic construction of a typical light-emitting element, for example, a ZnS thin-film light-emitting element, which as briefly discussed above, exhibits a hysteresis behavior illustrated in FIG. 2 in its light-emitting mechanism. The construction of the ZnS thin-film light-emitting element as well as the hysteresis behavior will be described referring to FIGS. 1 and 2.

The typical ZnS thin-film light-emitting element comprises a ZnS thin-film layer 1 containing as active material a transition metal such as the elements Mn, Cr or rare earth elements such as Tb, Er, Tm, Yb, a pair of dielectric layers 2, 3 such as $Y_20_3$ holding the ZnS thin-film layer therebetween, a transparent electrode 4 such as $Sn0_2$ and a background electrode 5 such as A1. In these drawings, 6 represents a glass plate associated with the transparent electrode 4 through which light emission from the ZnS thin-film layer 1 is derived. The dielectric layers 4, 5 have the purpose of preventing any influence caused due to the fact that the ZnS thin-film layer 1 has a low impedance. Two dielectric thin-film layers are not necessarily provided at both sides for this purpose and, therefore, one of these two thin-film layers may be obviated.

In such a construction of the ZnS thin-film light-emitting element, application of a proper AC pulse permits EL light emission and then the relation between the peak value V of the AC pulse and light intensity B shows the hysteresis curve as shown by FIG. 2. More particularly, once the peak value of the applied AC pulse voltage exceeds Vs(point A), the light intensity B increased by degrees and reaches its maximum value at the value Vw(point B). Thereafter, even when the applied AC pulse voltage falls below the value Vs(point C), light emission is maintained. And if the AC pulse voltage is below the value $V_E$(point D), then light emission ceases.

As briefly discussed above, the present invention is made to provide a drive system or method for the memory matrix panel whereby information or binary 0 or 1 is written, withdrawn or read on a desired point.

Figure 3:
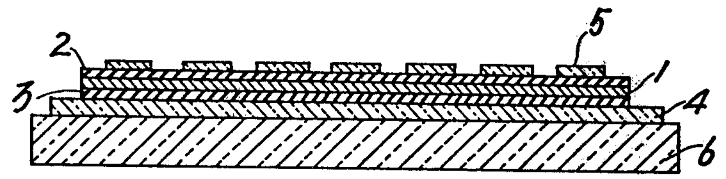
FIG. 3 is a cross-sectional view of a matrix memory panel.
Figure 4:
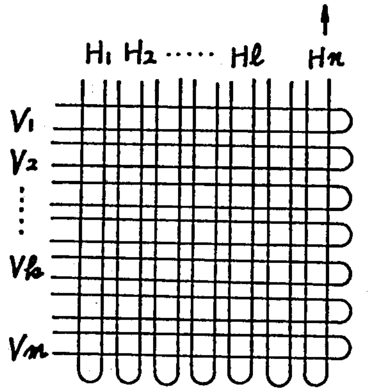
FIG. 4 is a plan view showing an electrode array in the panel of FIG. 3.

FIGS. 3 and 4 show the memory matrix panel composed of the ZnS thin-film light-emitting element and, especially, FIG. 3 shows a cross-sectional view of the panel and FIG. 4 shows a plane array of the electrodes 4, 5 which correspond to horizontal electrodes $H_1$ – Hn and vertical electrodes $V_1$ – Vm, respectively. As will be clear from the drawings, the memory matrix panel includes a plurality of picture units at the respective cross points of the horizontal electrodes $H_1$ – Hn and the vertical electrodes $V_1$ – Vm.

Figure 5:
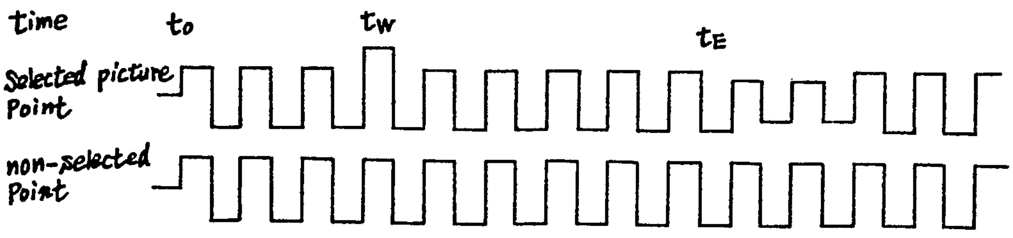
FIG. 5 is a waveform diagram used for explanation of a prior art drive system and method for the element of FIG. 1.

FIG. 5 illustrates an operational principal of writing information, binary 1 on a selected point of the memory matrix panel and then writing information, binary 0 on the same point (i.e., erasing).

During the period from $t_o$ to $t_w$, an AC current voltage (referred to as "maintenance pulse" hereinbelow) having the peak value Vs (see FIG. 2) is applied to all the picture points prior to the writing operation of information. If the writing voltage Vw (see FIG. 2) is applied to only the selected point at the time tw and the non-selected points receive the maintenance voltage, the selected point is at the condition (C, FIG. 2) and the remaining point is at the condition (A, FIG. 2) during the period tw $t_E$ so that only the selected point provides light emission at the high intensity Bw. Application of erase pulses (voltge $V_E$) to only the selected point at the time $t_E$ causes light emission at the selected point to disappear (in other words, information 0 is written). Accordingly, in order to drive the memory matrix panel, proper voltage is supplied to the horizontal electrodes and the vertical electrodes in a manner that the non-selected points receive only the maintenance pulses and only the selected points receive write pulses and erase pulses.

A practical but not a better drive system or method will be described with reference to FIG. 6. Assume now that the cross point (H1 . Vk) of the electrodes H1 and Vk is to be selected to accept information 1. An explanatory method is described wherein one half of the difference between the write voltage Vw and the maintenance voltage peak value Vs (that is, ½ (Vw – Vs)) is added to the selected electrodes H1, Vk together with the maintenance voltage (see FIG. 6(A), VH1, Vvk). In such a way, the voltage Vw necessary to write as shown by V (H1 . Vk) is supplied to the selected point (H1 . Vk) to write 1 thereinto (FIG. 6(C) . B), while only the maintenance pulse is supplied continuously to the point V (Hi . Vj) (FIG. 6(C). A) with no writing operation. All the picture points (H1 . Vj) (Hi . Vk) (as marked by oblique lines in FIG. 6(B)) on the selected electrode except the selected point, namely, all half-selected points receive the voltage ½ (Vw – Vs), and therefore, the writing operation is performed by a little degree, though it is not preferable, on these non-writing points (FIG. 6(C) . C).

It will be understood from the foregoing description that a small increase of the voltage over the maintenance voltage Vs is not permitted at the non-selected points, since the writing operation is performed by a little degree on the memory matrix panel when the voltage peak value exceeds Vs by a little degree. The applied alternating voltage is not limited to the square wave pulses of duty cycle 50% as shown in FIG. ((A), but the alternating voltage of such as the square wave pulses, the sine wave and the triangular wave pulses of any duty cycle may be applicable to the maintenance pulses when the alternating voltage does not vary its frequency. The present invention utilizes the above-mentioned degree of freedom whereby only a little increase of voltage over the maintenance voltage Vs does not occur at the nonselected points and the writing voltage Vw is applied only to the selected point in the writing mode operation.

An embodiment of the driving system of the present memory matrix panel will be described with reference to FIG. 7.

The memory matrix panel comprises the ZnS thin-film light-emitting layer sandwiched between a pair of dielectric layers 2, 3 and exhibiting the hysteresis characteristics, and the horizontal and the vertical electrodes $H_1$ – $H_n$, $V_1$ – $V_m$ as shown in FIGS. 3 and 4.

FIG. 7(*a*) and 7(*b*) respectively show waveforms of horizontal maintenance pulses of the amplitude VHj, which are applied to the horizontal electrode Hj and vertical maintenance pulses of the amplitude Vvt, which are applied to the vertical electrode Vi. The pulses are appplied to the respective electrodes in such a manner that the both pulses are opposite in polarity to each other. It will be understood from FIGS. 7(*a*) and 7(*b*), in accordance with the teachings of the present driving system, that the maintenance pulses of the amplitude Vs and being different from each other in phase by ¼ cycle are uniformly applied to any one of the respective horizontal and vertical electrodes Hj, Vi (It is referred to as "seesaw drive".). The present driving system is different from the prior system as shown in FIG. 5, in which all maintenance pulses are applied to one electrode (in the drawing the horizontal electrode) and the other electrode (the vertical electrode) is maintained at a constant level. In both, present and prior, driving systems, the element receives the alternating voltage of +Vs – –Vs voltage level. The horizontal electrodes of FIG. 5 receive the alternating voltage of the voltage level Vs – –Vs (voltage difference 2Vs), and the control thereof must be performed at the voltage levels Vs, 0, –Vs.

In the present driving system of FIG. 7, a point (Hj . Vi) receives alternating sustaining pulses as shown in FIG. 7(*e*) when the pulses of FIGS. 7(*a*) and 7 (*b*) are respectively applied to the horizontal and vertical electrodes Hj, Vi in order to bring the light-emitting element corresponding to the point to a suitable condition for the writing and erasing mode. One cycle of the sustaining pulses of FIGS. 6(*a*) and 7(*b*) is divided into four. The first cycle thereof corresponds to a horizontal sustaining pulse phase $\phi_A$, the second one corresponds to a vertical sustaining pulse phase $\phi_B$, the third one corresponds to a writing and erasing phase $\phi_C$ and the fourth one corresponds to a reading phase $\phi_D$, respectively. The horizontal and the vertical sustaining pulses are applied to the element at the phase of $\phi_A$ and $\phi_B$, which are different from each other in phase by ¼ cycle as shown in FIGS. 7(*a*) and 7(*b*).

When the light-emitting element at the point (H1 . Vk) in the memory matrix panel is selected to emit the light at the time period $t_w$, namely, in the writing operation, a horizontal electrode H1 is selected to receive a horizontal writing pulse PHW of the amplitude (Vw – Vs) in synchronization with the writing and erasing phase $\phi_C$ within the time period $t_w$ as is shown in FIG. 7(*c*), whereas a vertical electrode Vk is selected to receive a vertical writing pulse PVW which is obtained by phase shifting the vertical sustaining pulse PVR (marked by oblique lines) at the time period $t_w$ to the phase $\phi_C$ as is shown in FIG. 7(*d*).

Other horizontal and vertical electrodes are supplied with the ordinal sustaining pulses PR as shown in FIGS. 7(*a*) and 7(*b*). The horizontal electrodes Hj represent all the horizontal electrodes except H1, whereas the vertical electrodes Vi represent all the vertical electrodes except Vk.

When the above-mentioned writing pulses are applied to the point (H1 . Vk) of the light-emitting element, the element receives the writing pulse Pw of the peak value Vw at the writing and erasing phase $\phi_C$ within the time period $t_w$ as shown in FIG. 7(*h*), whereby the light-emission and the writing operation are performed. FIG. 7(*h*) shows the wave form of signals V (H1 – Vk) applied to the point (H1 . Vk).

Though other points (h1 . Vi), (Hj . Vk) on the selected electrodes except the selected light-emission point (H1 . Vk) receive signals V (Hi . Vk) of the wave form shown in FIGS. 7(*f*), 7(*g*), these points do not emit light since the voltage over the amplitude Vs of the sustaining pulses is not applied across these points at the time period $t_w$. Needless to say, any changes do not occur at other points (Hj . Vi) upon which the writing pulse is not applied.

Information written on the point (H1 . Vk) in such a way as is discussed above is memorized and the light emission is maintained by application of following horizontal and vertical sustaining pulses to the horizontal electrode H1 and the vertical electrode Vk.

The erasing operation of written information on the point (H1 . Vk) will be described with reference to time period $T_E$ of FIG. 7. The vertical electrode Vk is selected to receive a vertical erasing pulse PVE, which is obtainable by phase shifting the vertical sustaining pulse PVR (marked by dotted lines) at the time period $t_E$ to the writing and erasing phase $\phi_C$, whereas the horizontal electrode H1 is supplied with a horizontal erasing pulse PHE of the amplitude (Vs – $V_E$) at the writing and erasing phase $\phi_C$ within the time period $t_w$. Other electrodes Hj, Vi except H1, Vk are supplied with the ordinal sustaining pulses.

When the respective electrodes receive the above-mentioned pulses at the time period $t_E$, an erasing pulse PE shown in FIG. 7(*h*) is applied across the point (H1 . Vk), and therefore, the light-emission of the light-emissive element at the selected point is terminated and the information is erased. Other points (H1 . Vi), (Hj . Vk) and (Hj . Vi) do not receive the erasing pulse as is shown in the drawing, and therefore, any changes do not occur in the light-emission condition.

The following is a description of a reading out operation. The reading is carried out by detecting an electric current through the element. The principle of the reading out operation will be described with reference to FIG. 8.

When a voltage signal shown in FIG. 8(*a*) is applied to the ZnS thin-film light-emitting element, an electric current shown in FIG. 8(*b*) appears through the element. When the element does not emit light, a displacement current id appears at the leading edge of the pulse, whereas a polarization current ip shown by dotted lines in the drawing appears through the element when the element emits light. Therefore, determination as to whether the element emits light, namely, information 1 is written in the element, is easily achieved by detecting the polarization current ip.

Time period $t_R$ in the time chart of FIG. 7 shows the reading out operation of the present invention. The vertical electrode Vk is selected to receive a reading pulse, whereas the horizontal electrodes Hm are sequentially selected to determine as to whether the polarization current ip appears. The reading pulse P is obtained by phase shifting the vertical sustaining pulse PVR, which is applied to the vertical electrode Vk at the time period $t_R$, to the reading phase $\phi_D$. The pulse P acts as the sustaining pulse when the pulse P positions at either the vertical sustaining pulse phase $\phi_B$ or the reading phase $\phi_D$, and therefore, the written information can not be changed. When the polarization current ip is detected at the horizontal electrodes $Hm_1$, $Hm_2$ and the polarization current ip is not detected at the horizontal electrodes Hm ($m \neq m_1, m_2$) upon application of the reading pulse P to the vertical electrode Vk, it will be determined that the points ($Hm_1$ . Vk) and ($Hm_2$ . Vk) emit light whereas the points (Hm ($m \neq m_1, m_2$), Vk) do not emit light. The light-emission at every point on the memory matrix panel can be determined by sequentially selecting the vertical electrode Vk to be supplied with the reading pulse.

Since the polarization current ip flows in response to the leading edge of the read pulse P as shown in FIG. 8, the presence and absence of the polarization current ip may be sensed by detecting current flow through the horizontal electrode about the time $t_{R1}$. Assuming that the writing and reading of information is not carried out at the same time, another system and method may be considered wherein no read phase $\phi_D$ is provided and the read pulse is placed on the write phase $\phi_C$. Nevertheless, as shown in a timechart, FIG. 9(*a*) (*b*) (*c*), it is difficult to detect the polarization current ip in the above-mentioned system, because displacement current *i* caused by the trailing edge of the vertical maintenance pulse PVR to the vertical electrode Vi where no reading operation is effected, overlaps in time with the detection current (the displacement current id plus the polarization current ip of the pulse P) flowing in response to the leading edge of the read pulse P to the vertical electrode Vk where reading out is effected. In other words, the number of the vertical electrodes Vi ($i \neq k$) equals to the total number of the vertical electrodes minus 1 for one of the vertical electrodes Vk where the reading is effected. The displacement current flowing in response to the trailing edge of the vertical maintenance pulse PVR occupies most of the detection current *i* as shown in FIG. 9(*c*).

Nevertheless, the detection of the polarization current ip may be accomplished easily, as shown by the timing diagram of FIG. 10, by delaying the read pulse P to the point in time where there is no influence of the displacement current due to the trailing edge of the maintenance pulse PVR thereby corresponding the current flowing in response to the leading edge of the pulse P to one for a single picture point. That is to say, FIGS. 9 and 10 represent the voltage waveform Vvi applied to the vertical electrode Vi at their portions (a), the voltage waveform Vvk applied to the vertical electrode Vk at their portions (b) and the current waveform I for one horizontal electrode.

It will be understood that the above discussed drive method may be applied to another scheme wherein the horizontal electrode and the vertical electrode are substituted by each other. In addition, it will be ascertained that it is not necessarily required to erase the vertical maintenance pulse PVR when the writing operation is performed at the timing tw and further the leaving of the vertical maintenance pulse has no effect on the writing operation. Although the oblique portion enclosed by the broken lines is influenced by the vertical maintenance pulse PVR, this does not cause the cross point (H i . Vk) to provide light emission.

Although the foregoing disclosure sets forth the driving method for the memory matrix panel in accordance with the present invention, its implementation may be attained easily, for example, a write and erase logic is constituted by a combination of various digital $I^{C's}$, a panel driving output circuit is comprised of a logic circuit wherein an output is amplified via transistors having more than break down voltage Vw and read logic is comprised of a logic circuit which gates the polarization current ip.

In FIG. 11 showing one example of implementations of the driving system, $\phi_A$, $\phi_B$, $\phi_C$ and $\phi_D$ accept basic pulses synchronized with each other, Sw-E accepts control signals for horizontal writing and erasing, $S_R$ accepts control signals for the writing, erasing and reading. The writing and erasing modes are placed at the phase $\phi_C$ when Sw—E = 1 and when Sw—E = O.

The horizontal maintenance pulse PHR, the writing pulse PHW and erasing pulse PHE (FIG. 7) occur by inputting the control pulse Sw—E and the basic pulses $\phi_A$, $\phi_C$ to the various circuits as illustrated in FIG. 12 and FIG. 14. In order to make understanding of the present system easy, FIG. 7 shows the inversion of the outputs from the horizontal driver 13 and the vertical driver 12.

The shifted pulse relating to the gist of the present invention is obtainable from the vertical gate 10 shown in FIG. 12. The relation between the status of the respective terminals in FIG. 10 and the various modes such as maintenance, writing, erasing and reading may be represented as below:

| $Y_G(j)$ | $S_R$ | Yi(j) | mode |
|---|---|---|---|
| 0 | X | $\phi_B$ | maintenance |
| 1 | 0 | $\phi_C$ | writing erasing |
| 1 | 1 | $\phi_D$ | reading |

X . . . . . either 0 or 1

Displacement of the pulse on the vertical electrode will be described with reference to FIG. 10 and the foregoing table. For example, when $Y_G(1)=0$ an AND gate $A_1$ is opened only at the phase $\phi_B$ to provide the -basic pulse $\phi_B$. Therefore, during the phase $\phi_B$ the vertical maintenance pulse PVR is obtained from the vertical driver 12. On the contrary, when the terminal YG(1) is set to 1, the terminal $S_R$ is at the status 0 and an AND gate $A_2$ the pulse $\phi_C$ therefrom and a vertical driver 12 derives the vertical writing (or erasing) pulse PVW. If the terminal $S_R$ is at the status 1, an AND gate $A_3$ and the vertical driver 12 derives the read pulse P at the phase $\phi_D$. In this way, the horizontal, vertical maintenance pulses, writing and erasing pulses and reading pulses are obtained from the above-discussed circuit.

It is to be understood that the above-described embodiments are simply illustrative of the principles of the invention and that many embodiments may be devised without departing from the scope and spirit of the invention.

We claim:

1. In a drive method for a memory matrix panel which comprises a light-emitting body having hysteresis behavior responsive to application of a desired AC voltage, a plurality of horizontal electrodes disposed on a first major surface of the light-emitting body and a plurality of vertical electrodes disposed on a second major surface of the light-emitting body, each cross point of the both electrodes providing a light-emitting unit point in a matrix array, wherein a period of the applied AC voltage includes at least three sections, said method comprising:

applying a horizontal maintenance pulse having an amplitude necessary to maintain light emission to the plurality of horizontal electrodes during the first section of the AC voltage period prior to the writing, erasing or reading of information;

applying a vertical maintenance pulse having an amplitude necessary to maintain light emission to the vertical electrodes during the second section of the AC voltage period prior to the writing, erasing or reading of information;

applying an enable pulse having the shape identical with that of the horizontal maintenance pulse but the phase shifted into the third section of the AC voltage period to the vertical electrode associated with a selected point to perform the writing, erasing or reading of information on such selected point; and applying to the horizontal electrode associated with such selected point a write, erase or read pulse each having a predetermined amplitude necessary to perform the write, erase or read operation, the respective amplitudes being superimposed on the enable pulse.

* * * * *